United States Patent
Bhatia et al.

(10) Patent No.: US 7,622,979 B2
(45) Date of Patent: Nov. 24, 2009

(54) DYNAMIC VOLTAGE SCALING FOR SELF-TIMED OR RACING PATHS

(75) Inventors: Ajay Bhatia, Santa Clara, CA (US); Rajesh Khanna, Fremont, CA (US)

(73) Assignee: Sun Microsytems, Inc., Santa Clara, CA (US)

( * ) Notice: Subject to any disclaimer, the term of this patent is extended or adjusted under 35 U.S.C. 154(b) by 77 days.

(21) Appl. No.: 11/932,311

(22) Filed: Oct. 31, 2007

(65) Prior Publication Data

US 2009/0108899 A1 Apr. 30, 2009

(51) Int. Cl.
*H03K 3/00* (2006.01)
(52) U.S. Cl. ........................................ 327/297; 327/298
(58) Field of Classification Search .................. None
See application file for complete search history.

(56) References Cited

U.S. PATENT DOCUMENTS

| 6,510,191 | B2 * | 1/2003 | Bockelman | 375/371 |
| 7,349,515 | B1 * | 3/2008 | Chew et al. | 375/376 |
| 2007/0045825 | A1 * | 3/2007 | Chan et al. | 257/723 |
| 2008/0079458 | A1 * | 4/2008 | Shin et al. | 326/30 |

* cited by examiner

*Primary Examiner*—An T Luu
(74) *Attorney, Agent, or Firm*—Osha • Liang LLP (57) ABSTRACT

A timing-constrained circuit (e.g., a self-timed circuit) of optimal performance is achieved by allowing the delay of the circuit to be changed dynamically as a function of operating conditions (e.g., operating voltages or temperatures). The delay of timing signals in the timing-constrained circuit for a given operating condition may be selected to have the minimum margin for that operating condition among the available delays to maximize performance over the entire dynamic range of operating conditions.

34 Claims, 5 Drawing Sheets

| Truth Table | | |
|---|---|---|
| Mode | Reflop/Relat | Saenpredrv |
| 1 | 1 | From LØclk falling edge |
| Ø | 1 | From LØclk rising edge |
| X | Ø | Ø |

*FIG. 4B-2*

| FIG. 4B-1 | FIG. 4B-2 |
|---|---|

Key to
*FIG. 4B*

US 7,622,979 B2

DYNAMIC VOLTAGE SCALING FOR SELF-TIMED OR RACING PATHS

BACKGROUND OF THE INVENTION

A robust design for an integrated circuit takes into account a wide range of possible operating conditions, including process variations, operating voltage variations and operating temperatures ("PVT variations"). Such attention is especially required for a signal which timing is tightly constrained (a "timing-constrained signal"; circuits containing such signals are termed "timing-constrained circuits"). Timing-constrained signals include, for example, self-timed signals and racing paths. Self-timed paths are expected to be frequency independent, and all timing constraints on a racing path must be satisfied at all operating conditions. In this regard, racing paths are signal paths that are asynchronous with respect to each other, as to which one or more timing constraints apply. A self-timed path is a signal path in which timing is provided by a locally generated timing signal, rather than by a global clock signal. The timing signal is used, for example, to gate a data signal that is developed concurrently. To achieve that purpose, the timing relationship between the timing signal and the data signal must satisfy some design constraints. The timing signal of a self-timed path may be achieved, for example, by serially connected delay elements (e.g., inverters). As the propagation delays of the delay elements vary with PVT conditions, the timing relationships of data and timing signals may not be able to meet design constraints, resulting in glitches or other functional failures. Generally, at a lower operating voltages, the propagation delay increases.

In the prior art, to ensure that an integrated circuit can reliably operate over the entirety of its expected range of operating voltages, sufficient timing margins are included in the self-timed and racing paths such that the timing requirements are met even in the worst case. As a result, under some operating conditions, the included timing margins become unnecessarily large, thereby resulting in a lower (and possibly unacceptable) performance.

In some designs, for example, the bias voltages that are used to limit the currents in delay elements are selected at the time of manufacturing testing by programming static fuses, so that the delay elements in a timing chain may provide a sufficient delay even in the worst operating condition. In such designs, there is no dynamic flexibility to respond to actual operating conditions.

SUMMARY

This invention optimizes performance of a self-timed circuit by allowing delay of the self-timed circuit to be changed dynamically as a function of operating conditions (e.g., operating voltages or temperature). According to this invention, the delay of a self-timed circuit for a given operating condition may be selected to have the minimum margin for that operating condition among the available delays, at the time the operating condition occurs. The resulting design is an optimal design which avoids excessive design margins for that operating condition. Likewise, the delays of racing paths may be dynamically adjusted as operating conditions change to maintain a minimum required margin.

This invention is better understood upon consideration of the detailed description below in conjunction with the accompanying drawings.

DETAILED DESCRIPTION OF THE PREFERRED EMBODIMENTS

This invention is applicable to circuits with timing constraints (e.g., a self-timed circuit), and is particularly applicable to such circuits implemented as integrated circuits and systems in which operating voltages and clock frequencies may be varied dynamically according to operating conditions. For example, in a microprocessor suitable for use in a handheld device, the operating voltage and the clock frequencies may be varied based on the microprocessor's processing needs. The ability to adjust these operating conditions—sometimes known as dynamic voltage and frequency scaling (DVFS)—achieves high power efficiency.

In one application, a self-timed circuit is provided multiple timing chains for generating timing signals having predetermined delay characteristics for selected operating conditions. During operation, a multiplexer selects a suitable timing signal for the self-timed circuit according to the current operating condition. The operating condition may be a function of the processing parameters of a manufacturing process, the operating voltages or the operating temperatures. A storage circuit may be provided for holding a set of parameter values which characterize each of the possible operating conditions. The parameter values may be determined during a manufacturing test. By providing a suitable number of timing chains with different delay characteristics, a desirable delay margin may be achieved across all process, voltage and temperature variations.

For a timing-constrained circuit to be used in an application in which the circuit is expected to operate under a dynamic voltage range, a timing signal of an optimal delay for any operating voltage within the dynamic voltage range may be selected from the available timing chains or programmable delay elements. Consequently, an optimal design is maintained throughout the dynamic voltage range, resulting in an improved manufacturing yield.

In this detailed description, one embodiment of this invention is illustrated, by way of example, a self-timed circuit associated with a sense amplifier found in a memory circuit, such as a static random access memory (SRAM) or a dynamic random access memory (DRAM) circuit. Among DRAM circuits, this application is applicable, for example, to the double-data rate (DDR) DRAM circuits. In a memory circuit, a typical synchronous read sensing path starts from a common clock or common point. One path goes though a word line and a bit cell and develops a bit line voltage differential. The other path goes through either a dummy path or a delay chain to generate a sense amplifier strobe signal. These paths do not scale uniformly as the operating voltage changes. As the operating voltage changes, the dynamic voltage scaling technique of this invention allows the delay in a sensing path be set, such that the sense amplifier would always fire with a required bit line differential to maintain speed and performance.

A self-timed circuit may be used in a sense amplifier of a memory array. In one embodiment, serially connected delay elements form a number of timing chains of different number of delay elements. The self-timed circuit according to this invention may be advantageously used in a system which dynamically changes operating voltages and clock frequencies as a function of operating conditions.

Figure 1:
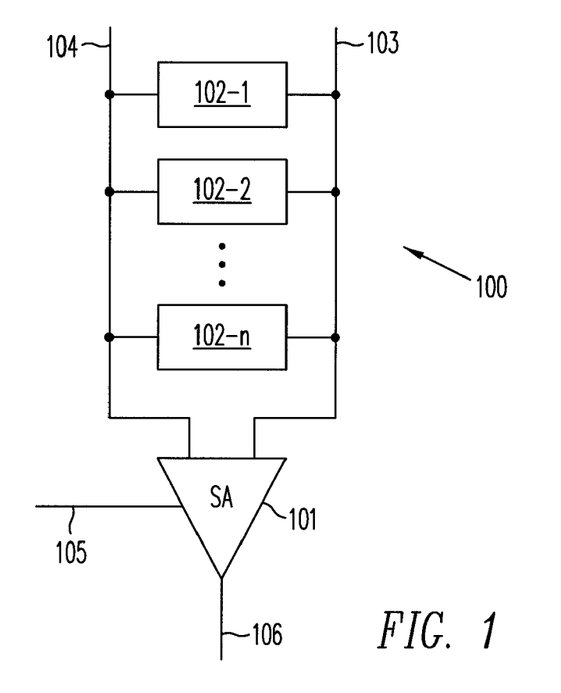
FIG. 1 shows memory unit 100, which includes sense amplifier 101 that receives a differential data signal on bit lines 103 and 104; sense amplifier 101 is enabled by timing signal 105 generated by a self-timed circuit.

FIG. 1 shows memory unit 100 which includes sense amplifier 101 that receives a differential data signal on bit lines 103 and 104. Sense amplifier 101 is enabled by timing signal 105 generated by a self-timed circuit. As shown in FIG. 1, memory unit 100 is an SRAM array that includes SRAM cells 102-1, 102-2, ..., 102-n, each cell being connected to common bit lines 103 and 104. When an active word line signal selects one of SRAM cells 102-1, 102-2, ..., 102-n to be read, the data stored in the selected SRAM cell is driven onto bit lines 103 and 104 to provide a data value represented by the differential voltage across bit lines 103 and 104. Sense amplifier 101 is turned on after a minimum delay—to allow the voltage across bit lines 103 and 104 to develop—to provide an output signal at terminal 106 representing the logic state of the data stored in the selected SRAM cell.

Figure 2:
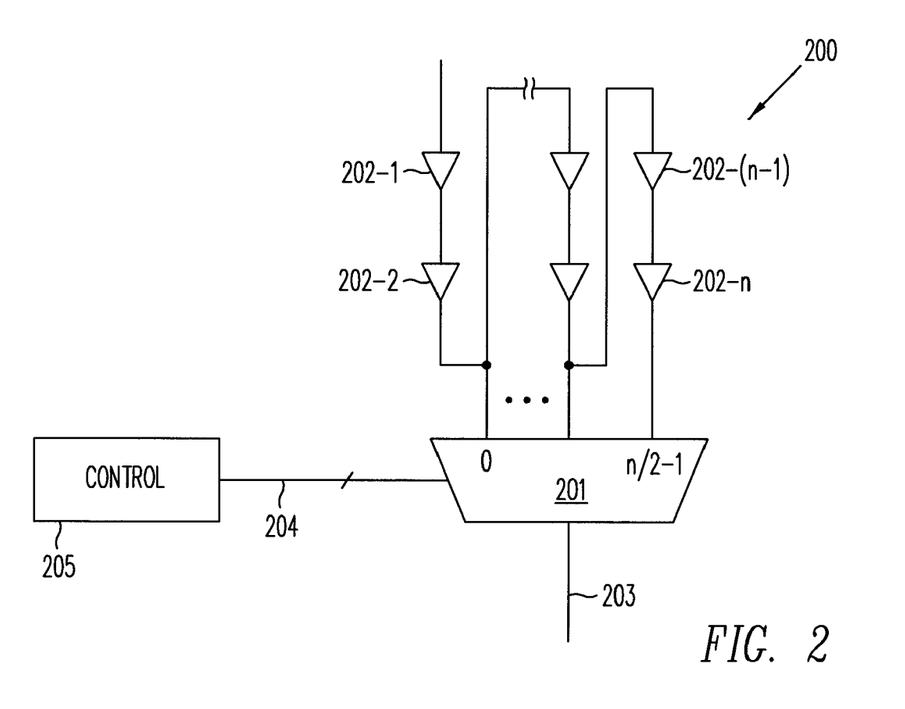
FIG. 2 shows circuit 200 which may be used to provide timing signal 105 of FIG. 1.

FIG. 2 shows timing chain 200 which may be used to provide timing signal 105 of FIG. 1. As shown in FIG. 2, multiplexer 201 selects output signal 203 from some output terminals of a string of serially connected delay elements 202-1, 202-2, ..., 202-n. The input signals of multiplexer 201 each represent an output signal of a timing chain having a predetermined number of delay elements. For example, as shown in FIG. 2, the k-th input signal of multiplexer 201 the output signal of a timing chain formed by 2(k+1) delay elements. In effect, therefore, output signal 203 represents the output signal of a selected one of k timing chains. In one implementation, using a 65-nm 11-metal layer one-volt manufacturing process, each inverter in the timing chain may be provided by a 3 μm wide, 70 nm channel-length PMOS transistor and a 1.5 μm wide, 70 nm channel-length NMOS transistor. The multiplexer may also be implemented using PMOS and NMOS transistors of like sizes.

Figure 3:
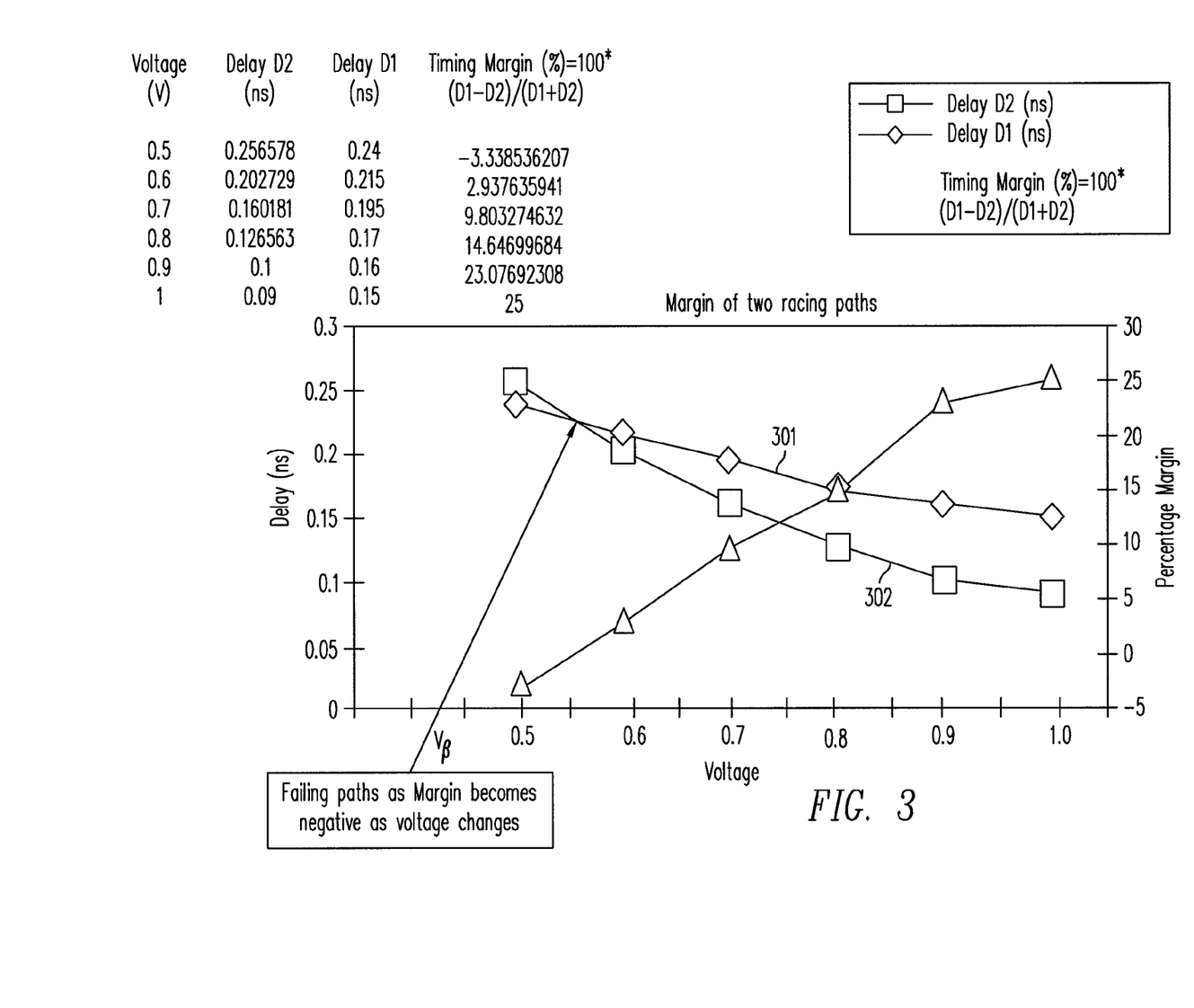
FIG. 3 illustrates the principle of operations in one embodiment of this invention.

FIG. 3 illustrates the principles of operation in one embodiment of this invention. In FIG. 3 curves 301 and 302 represent the delays of two racing paths D1 and D2, respectively, as a function of operating voltages. As shown in FIG. 3, at an operating voltage that is 0.6 volts or higher, the delay in path D1 is greater than the delay in path D2. The timing margin drops to zero at approximately an operating voltage of VB (e.g., between 0.5 volts and 0.6 volts), and becomes negative for an operating voltage below VB. Therefore, under this invention, path D1 may be adjusted (e.g., by introducing additional delays, as taught above with respect to FIG. 2) to maintain a positive margin. Such an adjustment may be performed dynamically. As shown in example of FIG. 2, for example, the additional delay may be introduced dynamically by suitably selecting delay values. Therefore, performance may be optimized by having (a) path D1 as configured to have the characteristics shown in FIG. 3 for an operating voltage above voltage VB and (b) an adjusted delay D1 with a greater delay for other operating voltages.

One implementation of the present embodiment of this invention can be realized by providing output signal 203 of FIG. 2 as timing signal 105 of FIG. 1. As output signal 203 may have any one of the k delays, the timing signal 105 therefore may be "tuned" to operate on any one of k timing chains, each having a different timing characteristic, of the type illustrated by FIG. 3. Referring back to FIG. 2, the bit pattern of select signals 204 of multiplexer 203 may be determined by the selected operating voltages and clock frequencies, so that a timing chain of different number of delay elements may be selected as a function of operating voltages and clock frequencies. The bit patterns may be provided in a table accessed by a control circuit (e.g., control circuit 205) which is indexed by a function of the operating voltages and clock frequencies, for example. Such a table may be provided in a non-volatile memory that can be programmed during manufacturing testing The operating voltage may be detected, for example, by a circuit that detects the supply voltage, regulator tap settings distributed or in the firmware.

Figure 4A:
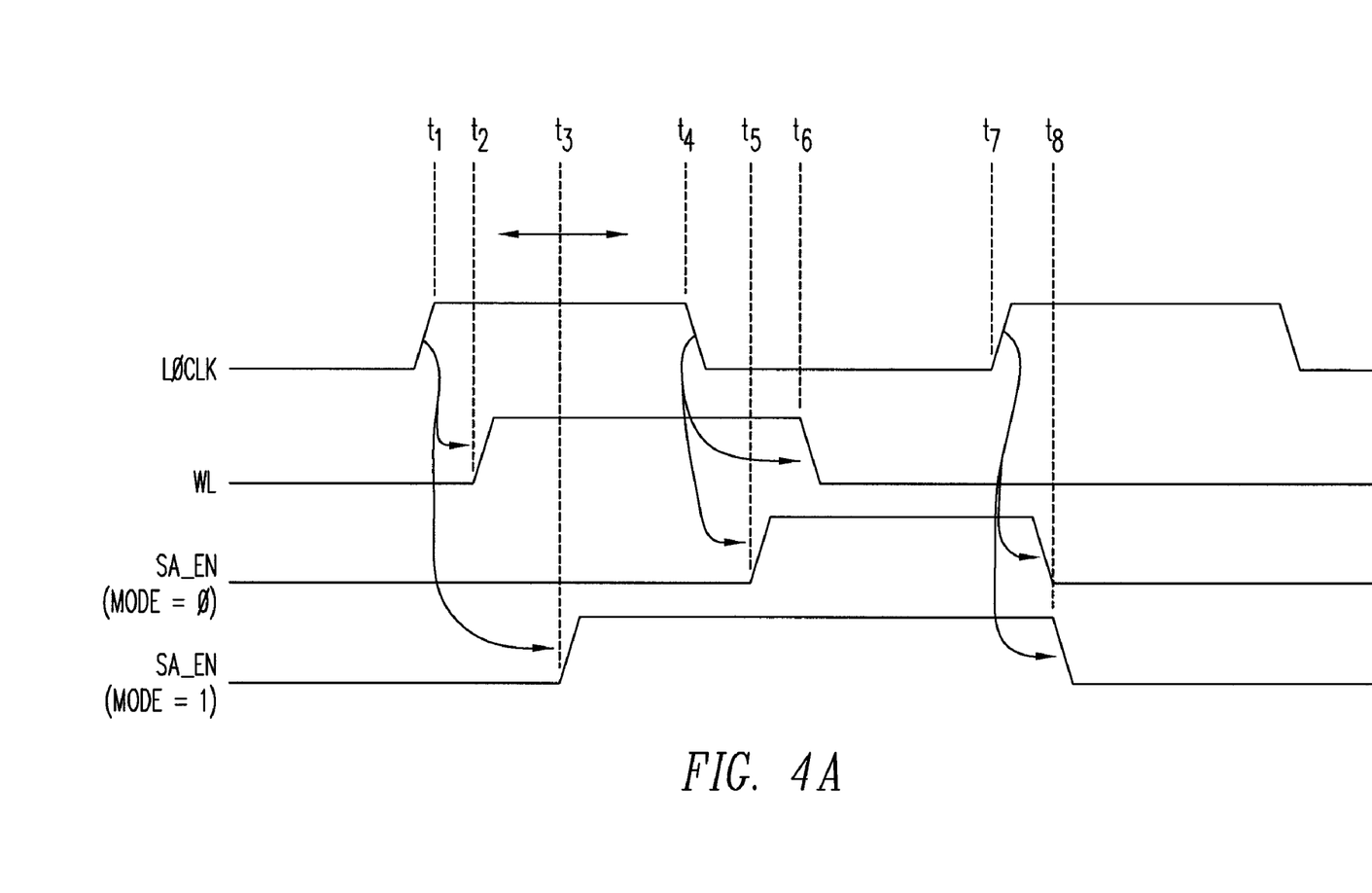
FIG. 4(a) illustrates operations of a timing signal SA_EN ("sense amplifier enable") for a sense amplifier using the principles of this invention.
Figure 4B:
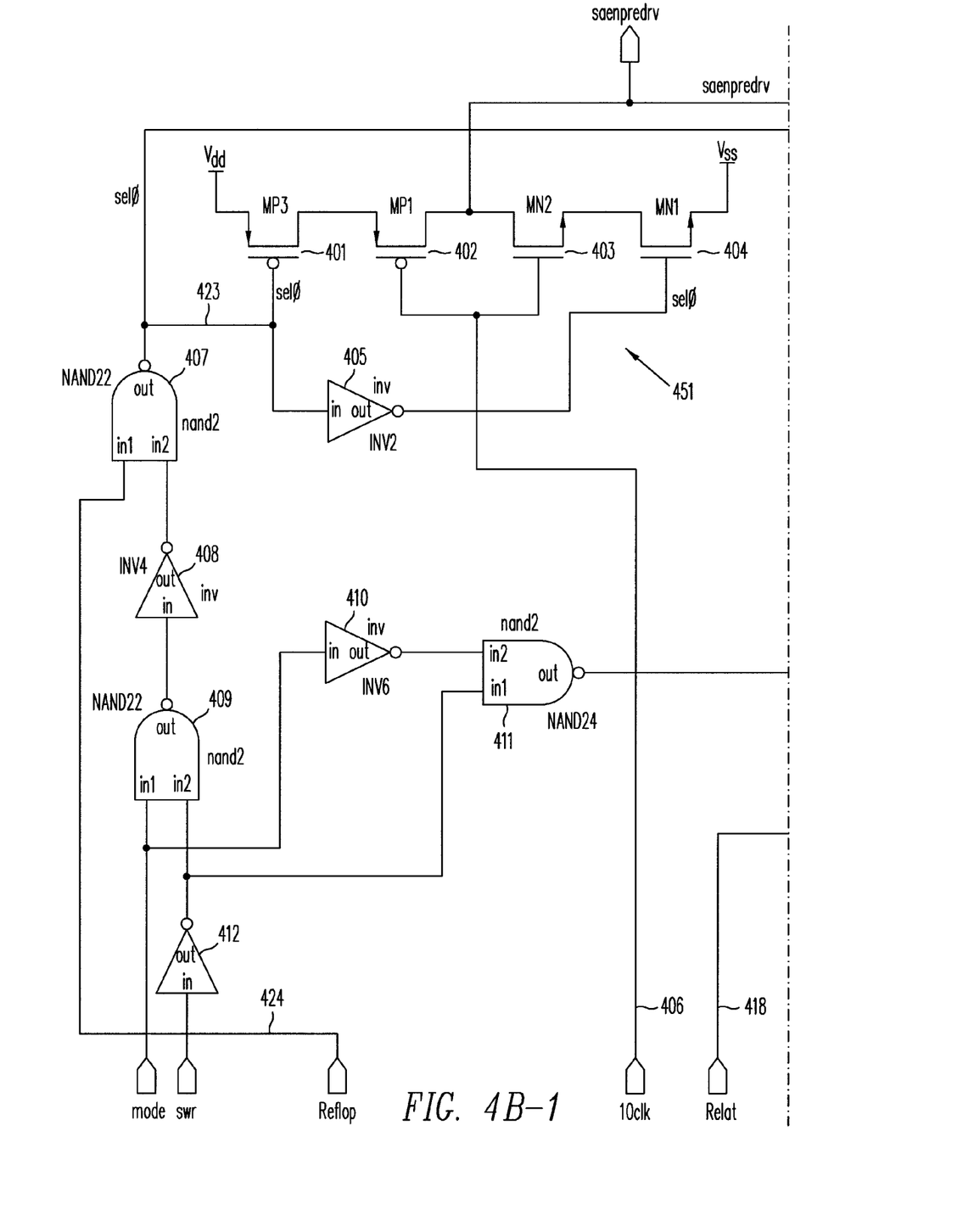
FIG. 4(b) shows output circuit 400 for providing timing signal SA_EN, according to one embodiment of this invention.

FIG. 4(a) illustrates operations of a timing signal SA_EN ("sense amplifier enable") for a sense amplifier using the principles of this invention. Timing signal SA_EN may be, for example, timing signal 105 of FIG. 1. In the example of FIG. 4(a), a mode signal selects between a first mode ("Mode 0") and a second mode ("Mode 1"). Under Mode 0, the timing of signal SA_EN is not tunable. Under Mode 1, however, the timing of signal SA_EN may be selected from various timing chains, such as already discussed above with respect to FIGS. 1-3. As shown in FIG. 4(a), in response to a rising edge clock signal L0CLK at time t1, word line WL is activated at time $t_2$ after a slight delay. Under Mode 0, signal SA_EN is active at time $t_5$, which follows the falling edge of clock signal L0CLK at time $t_4$, so as to allow ample time for the differential data signal on the bit lines to develop. Word line signal WL may be deactivated at time $t_6$ by the falling edge of clock signal L0CLKUnder at time $t_4$. Mode 1, however, lesser timing margin is provided by activating signal SA_EN earlier at time $t_3$, triggered by the rising edge of clock signal L0CLK at time t1. Time $t_3$ may be set by selecting the appropriate timing chain in response to the operating voltage, using the tuning mechanism described above. In either mode, a second rising edge of clock signal L0CLK deactivates signal SA_EN.

Figures 4B, 4B:
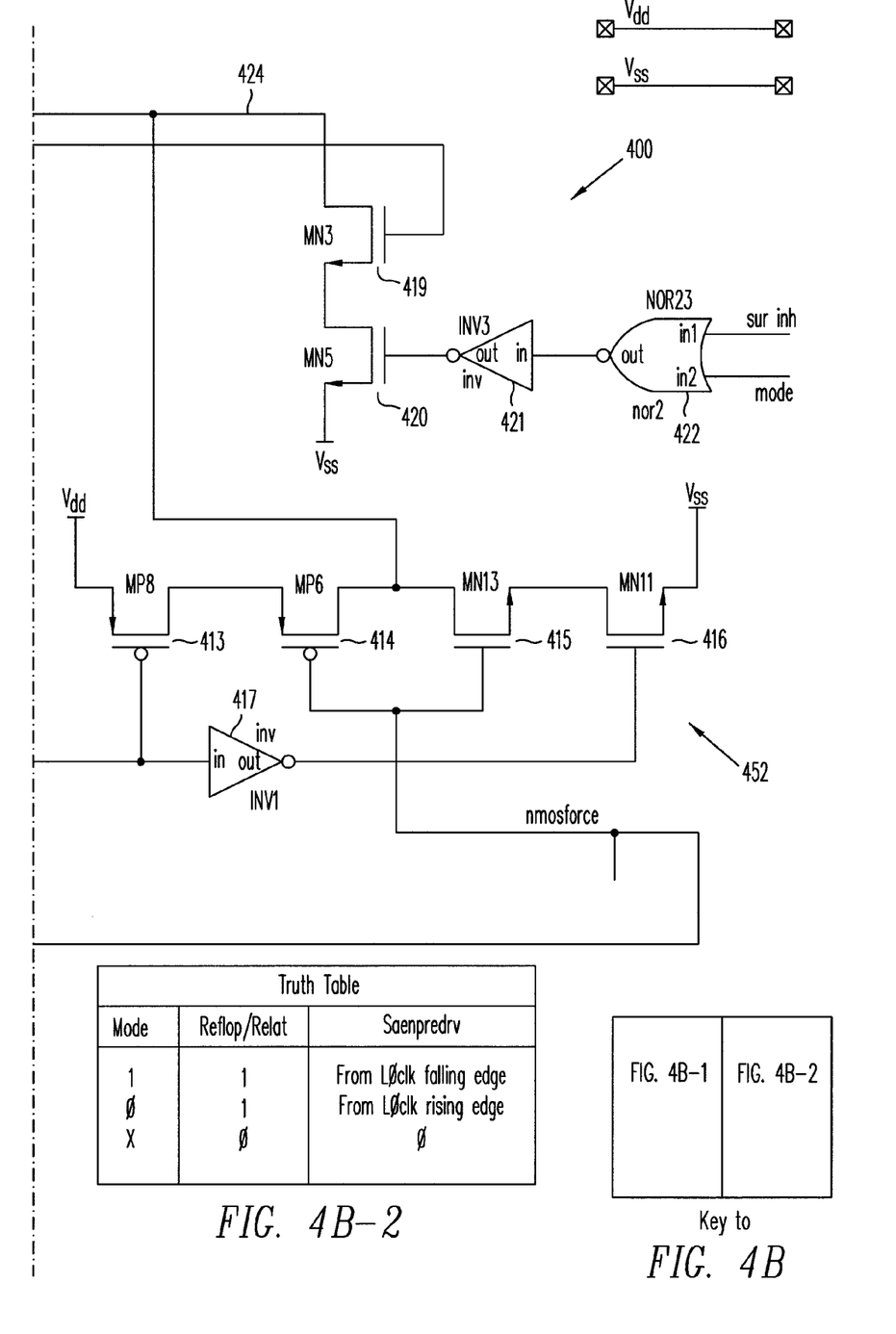

FIG. 4(b) shows an output circuit 400 for providing timing signal SA_EN, according to one embodiment of this invention. As shown in FIG. 4(b), logic gates 408-412 form a multiplexer that selects between Modes 0 and 1. Under mode 0, signal "reflop" is initially asserted, logic gate 407 resets output terminal 424 to ground reference through NMOS transistors 419 and 420. NMOS transistors 419 and 420 may be implemented, for example, using transistors of 60 nm channel lengths and 0.4 μm widths. When signal "reflop" is deasserted, the control signal at terminal 423 is active, thereby activating amplifier 451 formed by PMOS transistors 401 and 402, and NMOS transistors 403 and 404. Activated amplifier 451 provides on output terminal 424 a signal that is the complement of the signal provided at input terminal 406. In this implementation, the signal provided at input terminal 406 is a version of clock signal L0CLK, so that the signal at output terminal 424 has a rising edge falling the falling edge of clock signal L0CLK. In one implementation, circuit 400 may be implemented using, for example, a 65-nm 11-metal layer one-volt process. In that implementation, PMOS transistor 401 may be implemented by a transistor of 6.75 μm width, PMOS transistor 402 may be implemented by a transistor of 5.2 μm width, NMOS transistor 403 may be implemented by a transistor of 2.25 μm width, and NMOS transistor 404 may be implemented by a transistor of 4.8 µm. All transistors in amplifier 451 may have a channel length of 60 nm.

Under Mode 1, the output signal of a tunable circuit (e.g., output signal 203 of circuit 200 of FIG. 2 is provided at input terminal 418. When Mode 1 is selected, amplifier 452 is activated. Amplifier 452 may be formed by PMOS transistors 413 and 414 and NMOS transistors 415 and 416. Therefore, the output signal at output terminal 424 is complementary to the input signal at terminal 418, and thus has the selected desired timing characteristics. Using the process discussed above, PMOS transistor 413 may be implemented by a transistor of 6.75 µm width, PMOS transistor 414 may be implemented by a transistor of 5.2 µm width, NMOS transistor 415 may be implemented by a transistor of 2.25 µm width, and NMOS transistor 416 may be implemented by a transistor of 4.8 µm. All transistors in amplifier 452 may have a channel length of 60 nm.

One application of this invention is in satisfying the "full chip min time" constraint. In a synchronous "flop-bound" design, there are two timing parameters: the "max path/set up" timing and the "min path/hold time" timing. The max path/set up timing depends upon the cycle time and refers to the sum of (a) the propagation delay from clock input to data output delay of the flip-flop at the beginning of the path, (b) the propagation delays of the combinational gates in the path, and the set up time. The min path/hold time timing refers to the sum of (a) the clock input to data output delay of the flip-flop at the beginning of the path, and (b) the propagation delays of the combinational gates in the path. The difference between these timings ("path constraint") should be less than the sum of the hold time and skew. If this constraint is not satisfied, new data would race into the flip-flop at the end of path, thus causing a functional failure.

As the delay characteristic of a standard CMOS gate depends on the slew rate, fanout, beta ratio and PVT, as voltage changes, the delay of the standard gates in the path may vary differently than the hold time of a flip-flop. The dynamic voltage scaling of the this invention allows the propagation delays of the gates to be dynamically modulated, such that the path constraint is satisfied at that voltage, rather than by adding a worst case delay.

Another application of this invention is in the distribution of clock signals across voltage domains. In such an application, a clock source is in one voltage domain, but the required distribution spans one or more voltage domains. Dynamic voltage scaling of this invention can modulate the insertion delay of the clock signal when one domain voltage changes in a different manner than the other domain or domains. This method can keep the insertion delay constant so that skew at different parts of the clock distribution may be constant as voltage changes.

As known by one of ordinary skill in the art, this invention, including any logic circuit or transistor circuit, may be modeled, generated, or both by computer based on a description of the hardware expressed in the syntax and the semantics of a hardware description language (HDL). Such HDL descriptions are often stored on a computer readable medium. Applicable HDLs include those at the layout, circuit netlist, register transfer, and/or schematic capture levels. Examples of HDLs include, but are not limited to: GDS II and OASIS (layout level); various SPICE languages, and IBIS (circuit netlist level); Verilog and VHDL (register transfer level); and Virtuoso custom design language and Design Architecture-IC custom design language (schematic capture level). HDL descriptions may also be used for a variety of purposes, including but not limited to layout, behavior, logic and circuit design verification, modeling, and/or simulation.

The detailed description above is provided to illustrate the specific embodiments of this invention and is not intended to be limiting. Numerous modifications and variations within the scope of this invention are possible. This invention is set forth in the following claims.

We claim:

1. A method for operating a timing-constrained circuit, comprising:

generating a first signal comprising a first delay from a reference edge under a first operating condition and a second delay from the reference edge under a second operating condition;

generating a second signal comprising a third delay from the reference edge under the first operating condition and a fourth delay from the reference edge under the second operating condition;

identifying an existence of the first operating condition;

selecting the first signal as a timing signal for the timing-constrained circuit in response to identifying the first operating condition;

identifying an existence of the second operating condition after identifying an existence of the first operating condition;

selecting the second signal as the timing signal for the timing-constrained circuit in response to identifying the second operating condition;

identifying an existence of the first operating condition after identifying an existence of the second operating condition; and selecting the first signal as the timing signal for the timing-constrained circuit in response to identifying the first operating condition, after identifying the second operating condition.

2. The method as in claim 1, wherein the first operating condition is a function of an operating voltage.

3. The method as in claim 1, wherein the first operating condition is a function of an operating temperature.

4. The method as in claim 1, wherein an output of the timing-constrained circuit activates a sense amplifier of a memory array after a predetermined bit line differential voltage is established.

5. The method as in claim 1, wherein the first signal is generated from a timing chain.

6. The method as in claim 5, wherein the second signal is generated from delay elements which form a part of the timing chain.

7. The method as in claim 1, further comprising using the timing-constrained circuit in a logic circuit which dynamically changes operating voltages as a function of an operating condition.

8. The method as in claim 1, further comprising using the timing-constrained circuit in a logic circuit which dynamically changes operating clock frequencies as a function of an operating condition.

9. The method as in claim 1, wherein the timing-constrained circuit comprises a self-timed circuit.

10. The method as in claim 1, wherein the timing-constrained circuit comprises a plurality of racing paths.

11. The method of claim 1, wherein the third delay exceeds the first delay.

12. The method of claim 1, wherein the first delay exceeds the third delay, and wherein the second signal fails a predetermined timing requirement of the first operating condition.

13. The method of claim 1, wherein the second delay exceeds the fourth delay.

14. The method of claim 1, wherein the fourth delay exceeds the second delay, and wherein the first signal fails a predetermined timing requirement of the second operating condition.

15. A timing-constrained circuit, comprising:
a first timing circuit generating a first signal, wherein the first signal comprises a first delay from a reference edge under a first operating condition, and wherein the first signal further comprising a second delay from the reference edge under a second operating condition;
a second timing circuit generating a second signal, wherein the second signal comprises a third delay from the reference edge under the first operating condition, and wherein the second signal further comprising a fourth delay from the reference edge under the second operating condition; and
a multiplexer operatively connected to the first timing circuit and the second timing circuit, wherein the multiplexer is configured to:
select the first signal as a timing signal in response to identifying the first operating condition;
select the second signal as the timing signal in response to identifying the second operating condition; and
select the first signal as the timing signal in response to identifying the first operating condition, after identifying the second operating condition.

16. The timing-constrained circuit as in claim 15, wherein the first operating condition is a function of an operating voltage.

17. The timing-constrained circuit as in claim 15, wherein the first operating condition is a function of an operating temperature.

18. The timing-constrained circuit as in claim 15, wherein an output of the timing-constrained circuit is used to activate a sense amplifier of a memory array after a predetermined bit line differential voltage is established.

19. The timing-constrained circuit as in claim 15, wherein the second timing chain includes delay elements which form a part of the first timing chain.

20. The timing-constrained circuit as in claim 15, wherein the timing-constrained circuit is provided in a system comprising a logic circuit which dynamically changes operating voltages as a function of an operating condition.

21. The timing-constrained circuit as in claim 15, wherein the timing-constrained circuit is provided in a system including a logic circuit which dynamically changes operating clock frequencies as a function of an operating condition.

22. The timing-constrained circuit as in claim 15, wherein the timing-constrained circuit comprises a self-timed circuit.

23. The timing-constrained circuit as in claim 15, wherein the timing-constrained circuit comprises a plurality of racing paths.

24. A computer readable medium storing a description of a timing-constrained circuit, where the timing-constrained circuit comprising:
a first timing circuit generating a first signal, wherein the first signal comprises a first delay from a reference edge under a first operating condition, and wherein the first signal further comprising a second delay from the reference edge under a second operating condition;
a second timing circuit generating a second signal, wherein the second signal comprises a third delay from the reference edge under the first operating condition, and wherein the second signal further comprising a fourth delay from the reference edge under the second operating condition; and
a multiplexer operatively connected to the first timing circuit, and the second timing circuit, wherein the multiplexer is configured to:
select the first signal as a timing signal in response to identifying the first operating condition;
select the second signal as the timing signal in response to identifying the second operating condition; and
select the first signal as the timing signal in response to identifying the first operating condition, after identifying the second operating condition.

25. The computer-readable medium as in claim 24, wherein the first operating condition is a function of an operating voltage.

26. The computer-readable medium as in claim 24, wherein the first operating condition is a function of an operating temperature.

27. The computer-readable medium as in claim 24, wherein an output of the timing-constrained circuit is used to activate a sense amplifier of a memory array after a predetermined bit line differential voltage has been established.

28. The computer-readable medium as in claim 24, wherein the first signal is generated from a first timing chain.

29. The computer-readable medium as in claim 28, wherein the second signal is generated delay elements which form a part of the first timing chain.

30. The computer-readable medium as in claim 24, wherein the timing-constrained circuit is provided in a logic circuit which dynamically changes operating voltages as a function of an operating condition.

31. The computer-readable medium as in claim 24, wherein the timing-constrained circuit is provided in a logic circuit which dynamically changes operating clock frequencies as a function of an operating condition.

32. The computer-readable medium as in claim 24, wherein the timing-constrained circuit comprises a self-timed circuit.

33. The computer-readable medium as in claim 24, wherein the timing-constrained circuit comprises a plurality of racing paths.

34. A timing-constrained circuit, comprising:
a first timing circuit generating a first signal, wherein the first signal comprises a first delay from an edge of a reference signal under a first operating condition, and wherein the first signal further comprising a second delay from the edge under a second operating condition;
a second timing circuit generating a second signal, wherein the second signal comprises a third delay from the edge under the first operating condition, and wherein the second signal further comprising a fourth delay from the edge under the second operating condition; and
a multiplexer operatively connected to the first timing circuit and the second timing circuit, wherein the multiplexer is configured to:
select the first signal as a timing signal after an existence of the first operating condition is identified;
select the second signal as the timing signal after an existence of the second operating condition is identified and after the existence of the first operating condition is identified; and
select the first signal as the timing signal after selecting the second signal;

a first tri-state inverter operatively connected to an output of the multiplexer and comprising a first plurality of transistors of a first type connected to a second plurality of transistors of a second type using a first connection;

a second tri-state inverter operatively connected to the reference signal and comprising a third plurality of transistors of the first type connected to a fourth plurality of transistors of the second type using a second connection; and a third connection joining the first connection and the second connection.

* * * * *